(12) United States Patent
Meisner et al.

(10) Patent No.: US 8,872,519 B2
(45) Date of Patent: *Oct. 28, 2014

(54) SYSTEM AND METHOD TO DETERMINE THE STATE OF CHARGE OF A BATTERY USING MAGNETOSTRICTION TO DETECT MAGNETIC RESPONSE OF BATTERY MATERIAL

(75) Inventors: Gregory P. Meisner, Ann Arbor, MI (US); Jan F. Herbst, Groose Pointe Woods, MI (US); Mark W. Verbrugge, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 636 days.

This patent is subject to a terminal disclaimer.

(21) Appl. No.: 12/545,311

(22) Filed: Aug. 21, 2009

(65) Prior Publication Data
US 2010/0079145 A1 Apr. 1, 2010

Related U.S. Application Data

(60) Provisional application No. 61/100,501, filed on Sep. 26, 2008.

(51) Int. Cl.
| | |
|---|---|
| *G01N 27/416* | (2006.01) |
| *G01R 1/16* | (2006.01) |
| *G01R 31/36* | (2006.01) |
| *B60L 11/18* | (2006.01) |
| *G01R 15/20* | (2006.01) |
| *H01M 10/48* | (2006.01) |
| *G01R 15/18* | (2006.01) |

(52) U.S. Cl.
CPC .............. *G01R 31/3665* (2013.01); *G01R 1/16* (2013.01); *Y02T 10/705* (2013.01); *Y02T 10/7005* (2013.01); *Y02T 10/7011* (2013.01); *G01R 15/18* (2013.01); *B60L 11/1851* (2013.01)
USPC .................... 324/432; 324/117 R; 324/117 H; 324/244; 324/246; 324/260; 324/262; 324/263; 324/425; 324/427; 429/90; 429/91; 429/92; 429/93

(58) Field of Classification Search
USPC .......................................... 324/432, 425, 427
See application file for complete search history.

(56) References Cited

U.S. PATENT DOCUMENTS

| | | | | |
|---|---|---|---|---|
| 5,093,624 A | * | 3/1992 | Stevenson | 324/426 |
| 5,132,626 A | * | 7/1992 | Limuti et al. | 324/432 |
| 5,250,903 A | * | 10/1993 | Limuti et al. | 324/427 |
| 5,537,042 A | * | 7/1996 | Beutler et al. | 324/432 |

(Continued)

OTHER PUBLICATIONS

Brian J. Koch, U.S. Appl. No. 11/935,120, filed Nov. 5, 2007, Method and System for Determining a State of Charge of a Battery.
Brian J. Koch, U.S. Appl. No. 11/947,466, filed Nov. 29, 2007, Method and System for Determining a State of Charge of a Battery.

(Continued)

*Primary Examiner* — Drew A Dunn
*Assistant Examiner* — Nathaniel Pelton
(74) *Attorney, Agent, or Firm* — BrooksGroup

(57) ABSTRACT

One exemplary embodiment includes a method including providing a battery, producing a first magnetic field so that a second magnetic field is induced in the battery, sensing a magnetic field resulting from the interaction of the first magnetic field and the second magnetic field, utilizing the sensed net magnetic field to determine the state of charge of the battery.

20 Claims, 4 Drawing Sheets

(56) References Cited

U.S. PATENT DOCUMENTS

| | | | |
|---|---|---|---|
| 6,285,185 B1* | 9/2001 | Asjes | 324/239 |
| 6,677,547 B2* | 1/2004 | Tanii et al. | 209/575 |
| 7,445,696 B2* | 11/2008 | You et al. | 204/228.8 |
| 7,521,842 B2* | 4/2009 | Tucker et al. | 310/339 |
| 2003/0178970 A1* | 9/2003 | Minamiura et al. | 320/116 |
| 2006/0049826 A1* | 3/2006 | Daneman et al. | 324/207.13 |
| 2008/0066978 A1* | 3/2008 | Sugai et al. | 180/65.2 |
| 2008/0079391 A1* | 4/2008 | Schroeck et al. | 320/106 |
| 2008/0186000 A1* | 8/2008 | Kimura et al. | 322/23 |
| 2009/0096413 A1* | 4/2009 | Partovi et al. | 320/108 |
| 2009/0243538 A1* | 10/2009 | Kelty et al. | 320/104 |
| 2010/0090654 A1* | 4/2010 | Breiting et al. | 320/137 |
| 2011/0074432 A1 | 3/2011 | Tinnemeyer | |

OTHER PUBLICATIONS

U.S. Patent Application of Brian J. Koch, U.S. Appl. No. 11/935,120, filed Nov. 5, 2007, Title: Method and System for Determining a State of Charge of a Battery.

U.S. Patent Application of Brian J. Koch, U.S. Appl. No. 13/048,716, filed Mar. 15, 2011, Title: Method and System for Determining a State of Charge of a Battery.

U.S. Patent Application of Brian J. Koch, U.S. Appl. No. 13/460,012, filed Apr. 30, 2012, Title: Method and System for Determining State of Charge of a Battery.

U.S. Patent Application of Brian J. Koch et al, U.S. Appl. No. 13/460,012, filed Apr. 30, 2012, Title: Method and System for Determining a State of Charge of a Battery.

* cited by examiner

SYSTEM AND METHOD TO DETERMINE THE STATE OF CHARGE OF A BATTERY USING MAGNETOSTRICTION TO DETECT MAGNETIC RESPONSE OF BATTERY MATERIAL

This application claims the benefit of U.S. Provisional Application No. 61/100,501 filed Sep. 26, 2008.

TECHNICAL FIELD

The field to which the disclosure generally relates to includes systems for measuring the state of charge of a battery, methods of using the same, and methods of determining or estimating the state of charge of a battery using magnetostriction to detect magnetic response of the battery material.

BACKGROUND

Stored energy in a battery may be used for a variety of applications from nanodevices, minidevices, consumer electronics, computers, defense, automotive, marine, and aerospace applications. In vehicle applications, the energy from the battery may be used solely to power devices or vehicles or may be used in combination with other power sources such as AC power, fuel cells, or combustion engines. The energy from the battery may be utilized to power a variety of such devices, included but not limited to, electric motors, drivetrains and the like.

In the operation of such devices, it may be desirable to know the remaining energy in the battery or the "state of charge" (SOC). The SOC refers to the stored energy in the battery that is available to be used at any given time relative to the stored energy that is available when the battery is fully charged. An accurate determination of the SOC allows for the device or vehicles to maximize performance and efficiency. An accurate determination of the SOC also allows for a determination as to whether or not energy from the battery should be utilized to perform a particular task in combination with an alternative power source such as a combustion engine or fuel cell, or whether a particular task can be completed using only energy from the battery.

SUMMARY OF EXEMPLARY EMBODIMENTS OF THE INVENTION

One exemplary embodiment includes a method including providing a battery, producing a first magnetic field so that a second magnetic field is induced in the battery, sensing a magnetic field resulting from the interaction of the first magnetic field and the second magnetic field, utilizing the sensed net magnetic field to determine the state of charge of the battery.

Other exemplary embodiments of the invention will become apparent from the detailed description provided hereinafter. It should be understood that the detailed description and specific examples, while disclosing exemplary embodiments of the invention, are intended for purposes of illustration only and are not intended to limit the scope of the invention.

BRIEF DESCRIPTION OF THE DRAWINGS

Exemplary embodiments of the invention will become more fully understood from the detailed description and the accompanying drawings, wherein.

DETAILED DESCRIPTION OF EXEMPLARY EMBODIMENTS

The following description of the embodiment(s) is merely exemplary (illustrative) in nature and is in no way intended to limit the invention, its application, or uses.

Figure 1:
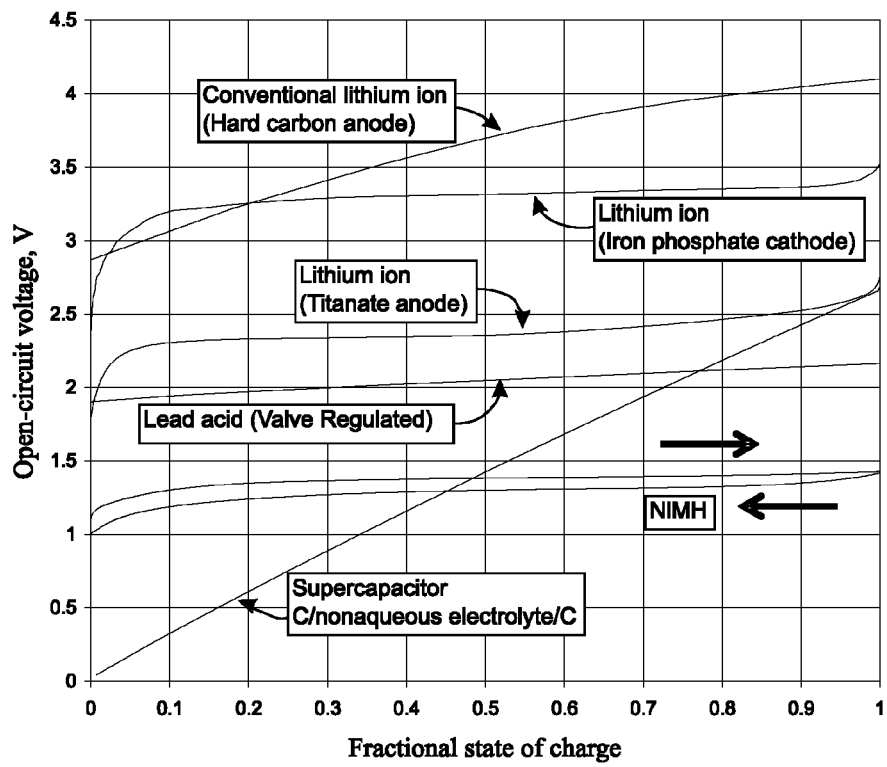
FIG. 1 is a graph of the open-circuit voltage versus SOC for representative electrochemical energy storage devices, and particularly illustrating the limitation of conventional SOC estimation using open-circuit voltage for lithium ion phosphate materials.

FIG. 1 is a graph of the open-circuit voltage versus "state of charge" (SOC) for a representative electrochemical energy storage devices. It has been discovered that for a lithium iron phosphate battery system, the open-circuit voltage versus SOC is relatively flat. In fact, using open-circuit voltage to determine the SOC may be adversely impact by noise in the system.

Figure 2:
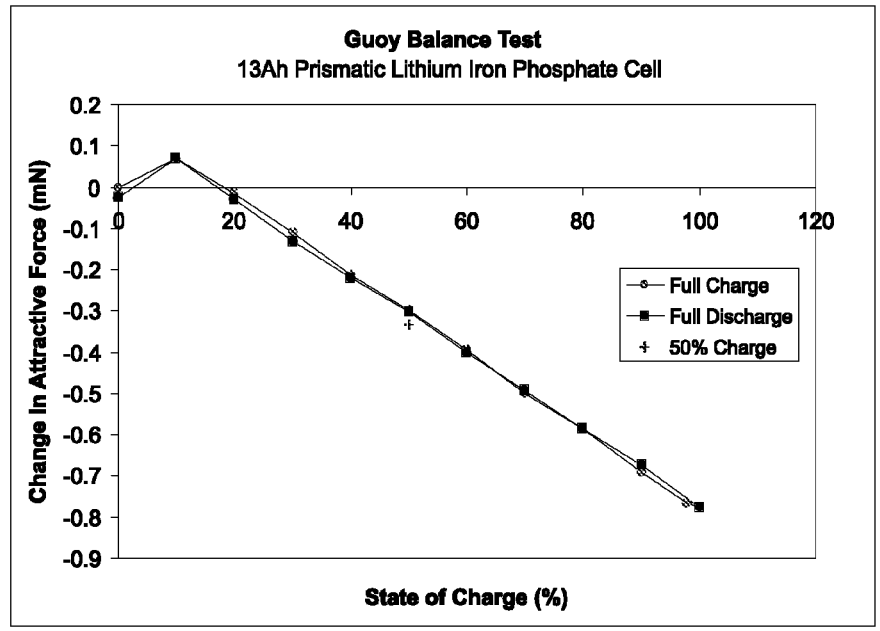
FIG. 2 is a graph illustrating the magnetic properties of lithium ion phosphate (change in attractive force (nN) v. SOC).

FIG. 2 is a graph of the magnetic properties of a 13Ah prismatic lithium iron phosphate battery cell (based on a Guoy balance test) showing the change in attractive force (mN) versus SOC for a battery that is fully charged, fully discharged, and 50% charged. It has been determined that iron phosphate has a paramagnetic susceptibility, which means that an external magnetic field induces a positive magnetization therein. The resulting attractive force between the lithium iron phosphate battery and a permanent magnetic can be measured using a Guoy balance arrangement. The measured force is proportional to susceptibility, and susceptibility changes with the SOC at the battery. Experiments indicate there is a linear and inversely proportional change in the attractive force as state of charge varies, for example as shown on FIG. 2.

Figure 3:
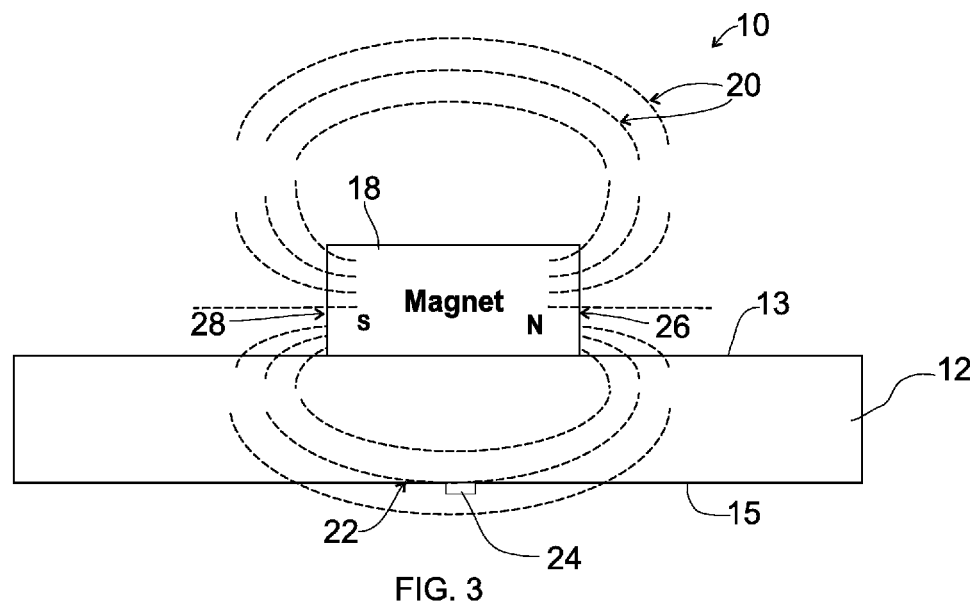
FIG. 3 illustrates one exemplary embodiment of a system useful in determining the SOC of a battery.

Referring now to FIG. 3, one exemplary embodiment may include a system 10 including a battery 12, a magnetic field generating component 14 and a magnetic field sensor 24. In one embodiment, the magnetic field generating component 14 may be a permanent magnet (e.g., Nd—Fe—B) having a north pole 26 and a south pole 28. The permanent magnet 18 produces a first magnetic field illustrated by lines 20. The first magnetic field induces a second magnetic field (not shown) in the battery. The permanent magnet 18 may be placed on a first face 13 of the battery 12 and a magnetic field sensor 24 may be positioned on an opposite face 15 of the battery 12. In one embodiment, the magnetic field sensor 24 may be a magnetostriction sensor. The first magnetic field of the permanent magnet 18 and the second magnetic field induced in the battery 12 interact to produce a net resultant magnetic field below the permanent magnet 18 which is sensed by the magnetic field sensor 24. The resultant magnetic field illustrated by lines 22 varies with the SOC of the battery. Resultant magnetic field may be mapped for various SOCs of the battery and for various magnetic fields produced by the magnetic generating component 14. Such information may be provided in a look up table or may be provided by algorithm. Furthermore, a signal produced by the magnetic field sensor 24 may be combined with other data indicative of the SOC from alternative inputs, such as but not limited to, conventional estimators that employ measured currents, voltages, and temperatures of the cell to extract the SOC, state of power or state of health of the battery. The combined or fusion of such inputs may be provided in a multidimensional look up table and/or by one or more algorithms to determine or estimate the SOC of the battery.

Figure 4:
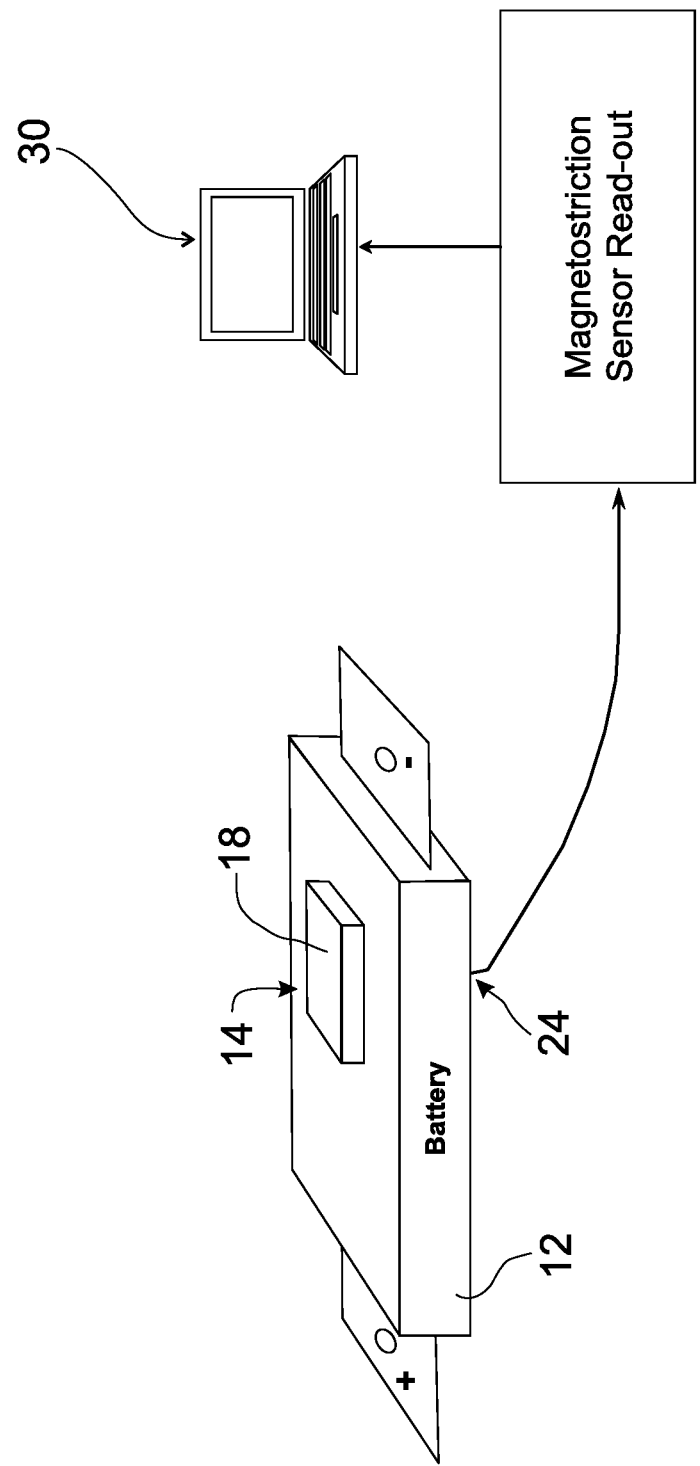
FIG. 4 illustrates another exemplary embodiment of a system useful in determining the SOC of a battery.

The sensed resultant magnetic field may be utilized to make determinations whether the battery should be charged. For example, but not limited to, when the battery state of charge is below a certain percentage, such as 10 or 15%. Furthermore, the information regarding the resulting magnetic field sensed by the magnetic field sensor 24, may be used to make determinations regarding operation of a device. For example, the information regarding the resultant magnetic field or the estimated magnetic field may be utilized to determine whether stored energy in the battery should be utilized to supplement power from a second source such as a combustion engine or fuel cell. In another example, information regarding the resulting magnetic field or the estimated SOC may be utilized to determine whether power solely from the battery should be utilized to propel a vehicle from a first speed to a second speed and thereafter use energy from another source such as a combustion engine or fuel cell to propel the vehicle at or above the second speed. Information regarding mapping of the signal from the magnetic field sensor 24 and the SOC of the battery may be stored in a computing device 30 which may include a central processing unit and memory as necessary, for example, as shown in FIG. 4. The computing device 30 may also be utilized to store multidimensional look up tables, algorithms, and software necessary to make determinations on how to use various components powered by the battery based upon the estimated state of charge of the battery.

Figure 5:
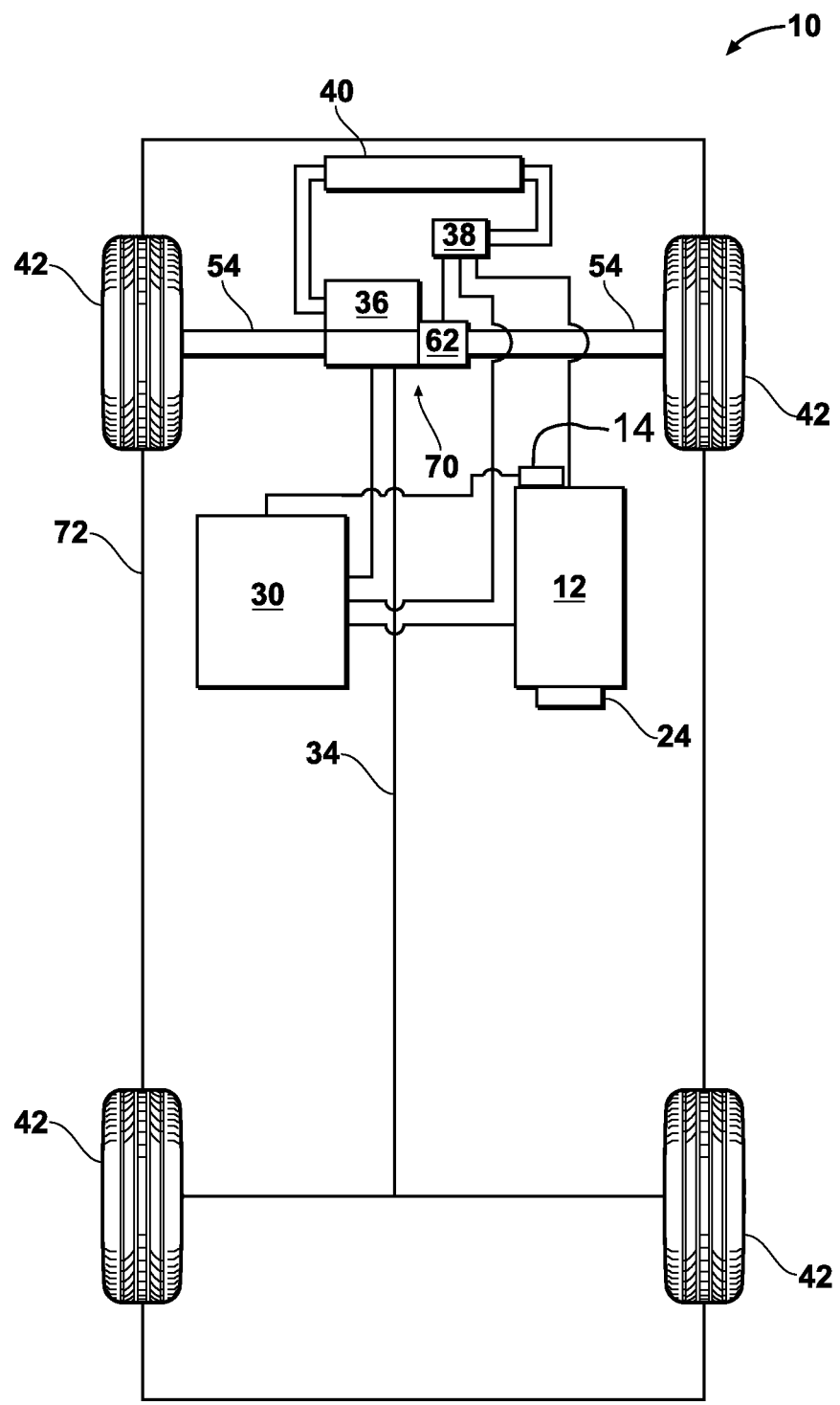
FIG. 5 is a schematic view of an exemplary embodiment of a vehicle including a battery SOC determination system.

Referring now to FIG. 5, one embodiment of the invention may include a system 10 including a vehicle having a body 32 coupled to a chassis 34. The system 10 may also include a computer processing unit or electric control module 30 in operable communication with an actuator assembly 70, a battery 12, the SOC system (14 and 24), and an inverter 26. Although not shown in detail, the CPU 30 may include various sensors and automotive control modules, or electronic control units (ECUs), and at least one processor and/or a memory which includes instructions stored thereon (or in another computer-readable medium) for carrying out the processes and methods as described herein.

During operation, still referring to FIG. 1, the vehicle may be operated by providing power to the wheels 42 with solely the battery 12, or in a hybrid capacity using a combination of the battery 12 and a combustion engine or fuel cell 30 to supply power to one or more motors to drive the wheels 42. In order to power the electric motor(s), DC power may be provided from the battery 12 to the inverter 38, which converts the DC power to AC power, prior to energizing the electric motor 62.

As will be appreciated by one skilled in the art, at various stages of operation, it is beneficial to have an accurate estimate of the SOC of the battery 12, particularly in an embodiment using a lithium ion battery. According to one exemplary embodiment, the magnetic field sensor 24 detects, or senses, a magnetic property of the battery 12. CPU 30 or similar device then determines or estimates the SOC of the battery 12 based, at least in part, on the sensed magnetic property or sensed resultant magnetic field.

Magnetic susceptibility describes the extent to which a material becomes magnetized in the presence of an applied magnetic field. The magnetic susceptibility per unit volume of the material, $\chi_v$, is given by the equation $$\chi_v = \frac{M}{H}, \tag{1}$$

where M is the magnetization expressed as the magnetic dipole per unit volume, and H is the applied magnetic field. Susceptibility may also be expressed per unit mass or per mole of the material. The mechanical force exerted by the applied magnetic field on the material is proportional to the susceptibility $\chi$ to the magnetic field strength, and to the magnetic field gradient. If $\chi$ is positive, the material is attracted to regions of increasing magnetic field strength and is described as being "paramagnetic." If $\chi$ is negative, the material is conversely repelled and is described as being "diamagnetic."

The magnetization induced in the material by the action of the applied magnetic field generates its own magnetic field that combines with the applied field. In the case of a paramagnetic material, the combined magnetic field is in general increased over the applied magnetic field alone, where that increase is proportional to the paramagnetic susceptibility of the material. In the case of a diamagnetic material, the resulting combined magnetic field is, conversely, reduced. Both cases can, in principle, be used for the purposes of this invention, but because paramagnetism is a much stronger phenomenon than diamagnetism, in general, the former is preferred.

Apart from magnetism generated by free circulating electrical currents, as in, e.g., electromagnets, magnetism in materials generally arises from both the localized spin of electrons and their orbital motion within atoms. Magnetic susceptibility is observed in free ions of the iron-group series, actinide-series, and rare-earth series elements on the periodic table. Compounds incorporating these elements also exhibit susceptibility, and some of these compounds find use as active materials for electrochemical energy storage in batteries. They often belong to a class known as intercalation compounds, which are characterized by the ability to have small ions (such as Li) readily inserted into and withdrawn from their solid-state structures. This behavior provides for the charge and discharge processes of the batteries.

Common metal oxides for lithium ion batteries that are intercalation materials include lithium cobalt oxide (LiCoO$_2$), lithium nickel oxide (LiNiO$_2$), and variants of the form LiCo$_x$Ni$_y$Mn$_z$O$_2$, where the cobalt, nickel, and manganese species occupy the same lattice and x+y+z=1. On the other hand, some materials form two phases and are referred to as simply insertion electrodes, a more general term that also comprises intercalation materials. An example of a two-phase insertion electrode presently being considered for use as a cathode in lithium ion batteries is iron phosphate (FePO$_4$). The relevant electrochemical reaction is $$\mathrm{Li}_{(1-n)}\mathrm{FePO}_4 + n\mathrm{Li}^+ + ne^- = \mathrm{Li}_n\mathrm{FePO}_4, \tag{2}$$

where n is the number of lithium ions and electrons involved in the reaction. During discharge of the battery, lithium is inserted into the iron phosphate, and while the battery is being charged, lithium is removed. The fraction of lithium in the material relative to the maximum amount of lithium the material can except (i.e., one Li in LiFePO$_4$) corresponds to the fractional state of charge, which when multiplied by 100 yields the state of charge.

When the free atoms, iron (Fe), phosphorous (P), and oxygen (O), in iron phosphate join, the individual electronic structures are modified to become part of the larger compound. The valence electrons of each atom contribute to bonding within the compound and charge transfer occurs among the atoms. The new electronic structure that is formed is characteristic of the specific compound and has a unique magnetic susceptibility associated with it. Further modification of the electronic structure occurs when more ions are introduced to the compound, as would be the case with insertion of lithium into the iron phosphate electrode during discharge of a lithium ion battery. This change has a measurable effect on the susceptibility of the electrode in proportion to the amount lithium added. By systematically varying the fraction of lithium in the electrode and measuring the corresponding susceptibility, $\chi$, it is possible to establish a relationship between the two variables. Embodiments of the present invention utilize changes in the magnetic susceptibility of the electrode to determine the state of charge of the battery.

Figure 6:
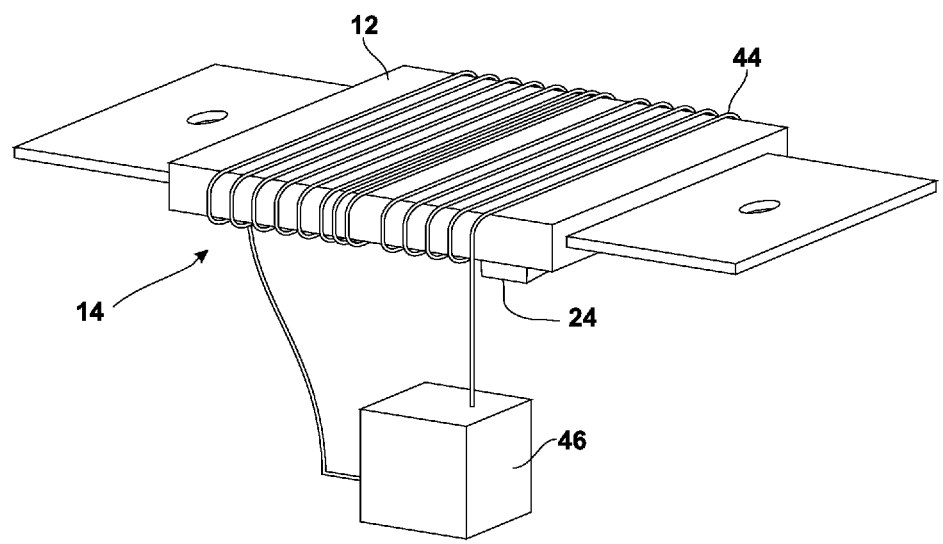
FIG. 6 illustrates an alternative embodiment of a battery SOC determination system.

Referring now to FIG. 6, in an alternative embodiment, the magnetic generating component 14 may include a coil 44 wrapped around the battery 12 and connected to a power source 46 which may indeed be the battery 12 or an alternative power source. Current flowing through the coil 44 may produce a magnetic field which induces a second magnetic field in the battery 12, and the resultant magnetic field may be sensed by the magnetic field sensor 24 on one face 15 of the battery 12.

In one embodiment, the magnetic field sensor 24 may be a magnetostriction sensor. Magnetostriction is the changing of a material's physical dimensions in response to changing its magnetization; i.e., a magnetostrictive material will change shape when it is subjected to a magnetic field. While the underlying mechanisms giving rise to magnetostriction are complex, the rotation and movement of magnetic domains in response to an external magnetic field causes a physical length change in the material. A magnetostrictive coefficient is often used to represent the fractional change in length of a material as the magnetization increases from zero to its saturation value. Published values can be found in Brown, W. F., Magnetic Materials, Ch 8 in the Handbook of Chemistry and Physics, Condon and Odishaw, eds., McGraw-Hill, 1958. Very accurate magnetic field sensors can be constructed based on magnetostrictive materials. The size/shape change of the material may be measured, for example but not limited to, using a strain gauge in conjunction with, or attached to, the magnetostriction material.

The above description of embodiments of the invention is merely exemplary in nature and, thus, variations thereof are not to be regarded as a departure from the spirit and scope of the invention.

What is claimed is:

1. A method comprising:
providing a battery;
producing a first magnetic field of a known constant strength so that a second magnetic field is induced in the battery;
sensing a net magnetic field resulting from the interaction of the first magnetic field and the second magnetic field;
utilizing the sensed net magnetic field to determine or estimate the state of charge of the battery.

2. A method is set forth in claim 1 wherein the sensing a magnetic field comprises providing a magnetic field sensor on a first face of the battery.

3. A method as set forth in claim 2 wherein the producing a first magnetic field comprises providing a magnetic field generating component on a second face of the battery opposite the magnetic field sensor, and causing the magnetic field generating component to produce the first magnetic field.

4. A method as set forth in claim 2 wherein the magnetic field sensor comprises a magnetostriction sensor.

5. A method as set forth in claim 1 further comprising taking action in response to the determined or estimated state of charge of the battery.

6. A method as set forth in claim 5 wherein the taking action comprises recharging the battery.

7. A method as set forth in claim 5 wherein the taking action comprises recharging the battery if the determined or estimated state of charged is less than 15%.

8. A method as set forth in claim 5 wherein the taking action comprises utilizing energy stored in the battery to at least partially power a motor.

9. A method as set forth in claim 1 wherein the producing a first magnetic field comprises providing a permanent magnet on a first face of the battery.

10. A method as set forth in claim 1 wherein the producing a first magnetic field comprises providing a coil wrapped around the battery and flowing current through the coil.

11. A method as set forth in claim 1 wherein the battery comprises a lithium ion battery.

12. A method as set forth in claim 11 wherein the lithium ion battery comprises an electrode comprising iron and phosphate.

13. A method as set forth in claim 1 wherein the battery comprises an electrode having a paramagnetic susceptibility.

14. A method comprising:
providing a battery;
producing a first magnetic field of a known constant strength so that a second magnetic field is induced in the battery;
sensing a net magnetic field resulting from the interaction of the first magnetic field and the second magnetic field;
correlating the sensed net magnetic field to the state of charge of the battery.

15. A product comprising:
a battery;
means for producing a first magnetic field of a known constant strength so that a second magnetic field is induced in the battery;
means for sensing a net magnetic field resulting from the interaction of the first magnetic field and the second magnetic field;
means for determining or estimating the state of charge of the battery by utilizing the sensed net magnetic field.

16. A product as set forth in claim 15 wherein means for sensing a net magnetic field resulting from the interaction of the first magnetic field and the second magnetic field comprises a magnetostriction sensor.

17. A product as set forth in claim 16 wherein the means for producing a first magnetic field of a known strength so that a second magnetic field is induced in the battery comprises a permanent magnet on a first face of the battery.

18. A product as set forth in claim 17 wherein the battery comprises a lithium ion battery.

19. A product as set forth in claim 18 wherein the lithium ion battery comprises an electrode comprising iron and phosphate.

20. A product as set forth in claim 15 wherein the battery comprises an electrode having a paramagnetic susceptibility.

* * * * *